United States Patent [19]

Tsukada et al.

[11] 3,989,610

[45] Nov. 2, 1976

[54] PHOTOSENSITIVE EPOXY-ACRYLATE RESIN COMPOSITIONS

[75] Inventors: Katsushige Tsukada; Asao Isobe; Nobuyuki Hayashi; Masahiro Abo; Ken Ogawa, all of Hitachi, Japan

[73] Assignee: Hitachi Chemical Company, Ltd., Japan

[22] Filed: Feb. 12, 1974

[21] Appl. No.: 441,795

[30] Foreign Application Priority Data

Feb. 14, 1973 Japan............................ 48-17914
July 18, 1973 Japan............................ 48-80345
Sept. 19, 1973 Japan............................ 48-105064

[52] U.S. Cl.......................... 204/159.15; 96/35.1; 96/115 R; 204/159.16; 204/159.23; 260/831; 260/836; 260/837 R; 427/54

[51] Int. Cl.²..................... C08F 8/00; C08L 63/02; C08L 63/10; G03C 1/70

[58] Field of Search................. 204/159.15, 159.23, 204/159.16; 260/836 R, 837 R, 831

[56] References Cited
UNITED STATES PATENTS

| | | | |
|---|---|---|---|
| 2,637,715 | 5/1953 | Ott...................................... | 260/831 |
| 3,301,743 | 1/1967 | Fekete et al......................... | 260/831 |
| 3,551,246 | 12/1970 | Bassemir et al.................... | 204/159.15 |
| 3,674,545 | 7/1972 | Strolle................................ | 204/159.15 |
| 3,707,583 | 12/1972 | McKown............................ | 260/837 R |
| 3,793,398 | 2/1974 | Hokamura......................... | 260/837 R |
| 3,806,483 | 4/1974 | Juba et al.......................... | 260/837 R |

*Primary Examiner*—John C. Bleutge
*Assistant Examiner*—Thurman K. Page
*Attorney, Agent, or Firm*—Craig & Antonelli

[57] ABSTRACT

A photosensitive resin composition consisting of, or comprising as the essential components, (A) a photo-polymerizable unsaturated compound having at least two terminal ethylene groups, (B) a sensitizer capable of initiating polymerization of the above unsaturated compound upon irradiation with active rays, (C) a compound containing at least two epoxy groups, and (D) a compound selected from the group consisting of dicyandiamide, p,p'-diaminodiphenyl compounds, polycarboxylic acids having at least two carboxyl groups, polycarboxylic anhydrides and mixtures of the polycarboxylic acids and the polycarboxlic anhydrides. The above photosensitive resin composition can give a protective film excellent in solvent resistance, chemical resistance, heat resistance and mechanical strengths, and hence, can be used in the production of printed circuit boards, precision-processing of metals and as materials for adhesives, paints, plastic relief and the like.

26 Claims, No Drawings

PHOTOSENSITIVE EPOXY-ACRYLATE RESIN COMPOSITIONS

This invention relates to a photosensitive resin composition. More particularly, this invention relates to a photosensitive resin composition for the formation of a protective film having excellent properties and capable of being used in the production of printed circuit boards, the precision-processing of metals or the like.

In the precision-processing industry, for example, in the production of a printed circuit board, it has heretofore been well known to use a photosensitive resin to form a protective film for plating and etching. Conventional photosensitive resins are (1) system of polyvinyl alcohol, gelatine and bichromate, and (2) system of polyvinyl cinnamate. Recently, a photo-polymerizable resin system has become used in addition to the above two systems. This system is inexpensive as in the above (1) system and has a storage stability and a high resolving power as the above (2) system has. In addition, the tolerance of film thickness is great and processing is easy. Therefore, the photo-polymerizable resin system can be supplied in the form of a film to users. In these respects, the photo-polymerizable system is excellent. However, the photosensitive resins which have heretofore been known, including the photo-polymerizable resins, have problems which have been desired to be solved. That is to say, the protective film obtained from the above systems is insufficient in solvent resistance, chemical resistance, heat resistance, and mechanical strengths, and hence, is limited in application field. For example, said film is resistant to neutral or weakly acidic solutions, but is not resistant to strongly acidic or alkaline solutions. Accordingly, there are some limitations with respect to treating agents for etching, plating and the like of said film. Furthermore, said film is not resistant to aromatic hydrocarbons, such as toluene and the like; chlorinated hydrocarbons, such as Triclene and the like; and ketones, such as methyl ethyl ketone, and is insufficient in mechanical strengths and heat resistance, and hence, cannot be used as permanent protective film. These are the reasons why the above photosensitive resins have not been employed in the field having hitherto used an epoxy resin screen printing system, such as resist for non-electrolytic copper plating, solder resist and the like.

In view of the above circumstances, the inventors have done extensive research to achieve this invention.

The object of this invention is to provide a photosensitive resin composition for forming a protective film excellent in solvent resistance, chemical resistance, heat resistance and mechanical strengths.

According to this invention, there is provided a photosensitive resin composition, which consists of, or comprises as the essential components, (A) a photopolymerizable unsaturated compound having at least two terminal ethylene groups, (B) a sensitizer capable of initiating polymerization of the above unsaturated compound upon irradiation with active rays, (C) a compound having at least two epoxy groups and (D) a compound selected from the group consisting of dicyandiamide, p,p'-diaminodiphenyl compounds, polycarboxylic acids having at least two carboxyl groups, polycarboxylic anhydrides and mixtures of the polycarboxylic acids and the polycarboxylic anhydrides.

The photosensitive resin composition of this invention must comprise a photo-polymerizable unsaturated compound having at least two terminal ethylene groups. This compound includes, for example, polyhydric alcohol acrylates and methacrylates, and preferable examples thereof are acrylates and methacrylates of triethylene glycol, tetraethylene glycol, ethylene glycol, propylene glycol, trimethylolpropane, pentaerythritol, neopentyl glycol and the like. Said photopolymerizable unsaturated compound also includes acrylates and methacrylates derived from modified bisphenol A, such as reaction product of acrylic acid or methacrylic acid with a bisphenol A-epichlorohydrin epoxy resin prepolymer and acrylates and methacrylates of alkylene oxide adduct of bisphenol A or its hydrogenation product. In addition to these esters, as the photo-polymerizable unsaturated compound, there may also usefully be used methylene-bis-acrylamide, methylene-bis-methacrylamide, bis-acryl- and bis-methacryl-amides of diamines, such as ethylenediamine, propylenediamine, butylenediamine, pentamethylenediamine, hexamethylenediamine, heptamethylenediamine, octamethylenediamine, etc. Furthermore, reaction products of diol monoacrylate or diol methacrylate with diisocyanate and triacryl formal or triallyl cyanurate are also suitable. Besides these monomeric compounds, there may be used linear high molecular weight compounds containing acryloyloxy or methacryloyloxy group in the side chain, for example, a ring-opening copolymerization product of glycidyl methacrylate or addition reaction products of acrylic or methacrylic acid with copolymerization product of glycidyl methacrylate with a vinyl compound, such as methyl methacrylate, styrene, ethyl acrylate, methyl acrylate or butyl methacrylate.

The second essential compound of the photo-sensitive resin composition of this invention is a sensitizer capable of initiating polymerization of the photopolymerizable unsaturated compound upon irradiation with active rays. Preferable sensitizers are benzophenone, Michiler's ketone, benzoin, benzoin alkyl ethers, anthraquinone, alkyl-substituted anthraquinones, such as 2-ethylanthraquinone, 3-t-butylanthraquinone, benzil and the like.

The photo-polymerizable unsaturated compound and the sensitizer may preferably be used in an amount of 10 to 90 % by weight and 0.1 to 15 % by weight, respectively, more preferably in an amount of 15 to 60 % by weight and 1 to 10 % by weight, respectively, based on the weight of the photosensitive resin composition.

The photosensitive resin composition of this invention contains further a compound having at least two epoxy groups as an essential component. Suitable compounds are so-called epoxy resin prepolymers, such as bisphenol A-epichlorohydrin condensate, polyolefin epoxides, novolac resin epoxides. For example, Epikote 828, Epikote 1001, Epikote 1004, Epikote 1007 (these are trademarks of Shell), Araldite ECN-1280, Araldite ECN-1273 (these are trademarks of Ciba), DEN 438, DEN 431 (these are trademarks of Dow) and Chissonox 221 and Chissonox 289 (these are trademarks of Chisso) may be used. Vinyl copolymerization products of glycidyl methacrylate may also be used. These may be employed alone or in admixture of two or more. The amount of the compound may preferably be 5 to 80 % by weight, more preferably 5 to 50 % by weight, based on the weight of the photosensitive resin composition.

The fourth essential component of the composition of this invention is selected from the group consisting of dicyandiamide, p,p'-diamino-diphenyl compounds, polycarboxylic acids having at least two carboxyl groups, polycarboxylic anhydrides and mixtures of the polycarboxylic acids and the polycarboxylic anhydrides. In the case of dicyandiamide, its preferable amount is 0.1 to 20 % by weight based on the weight of the composition, and its more preferable amount is 0.2 to 10 % by weight based on the weight of the composition. In the case of the p,p'-diaminodiphenyl compound, it may preferably be used in an amount of 1 to 30 % by weight, more preferably 2 to 20 % by weight, based on the weight of the composition. Further, in the case of the polycarboxylic acid and/or the polycarboxylic anhydride, it may preferably be used in an amount of 0.3 to 1.5 moles per mole of the epoxy group of component (C) in the composition.

As the p,p'-diaminodiphenyl compound, there may preferably be used p,p'-diaminodiphenylmethane, p,p'-diaminodiphenyl ether, p,p'-diaminodiphenyl sulfone, p,p'-diaminodiphenyl-dimethylmethane or the like, in view of storage stability, and the mechanical and chemical properties of cured products. These compounds may be used alone or in admixture of two or more.

The polycarboxylic anhydride used in this invention includes maleic anhydride, itaconic anhydride, succininc anhydride, citraconic anhydride, phthalic anhydride, tetrahydrophthalic anhydride, hexahydrophthalic anhydride, methyltetra-hydrophthalic anhydride, chlorendic anhydride, pyromellitic anhydride, trimellitic anhydride and copolymers of maleic anhydride with other vinyl compounds, such as methyl methacrylate, styrene, ethyl acrylate, methyl acrylate or butyl methacrylate. The polycarboxylic acid used in this invention includes polycarboxylic acids corresponding to the above polycarboxylic anhydrides and copolymers of acrylic or methacrylic acid with other vinyl compounds, such as methyl methacrylate, styrene, ethyl acrylate, methyl acrylate or butyl methacrylate. These may be used alone or in admixture of two or more.

Among the (D) components, dicyandiamide and the p,p'-diaminodiphenyl compound are more excellent in stability of composition. Particularly, dicyandiamide is most excellent. When flexibility is desired for cured product, the p,p'-diaminodiphenyl compound is suitable. When it is desired that the cured product has high mechanical strengths and chemical resistance, dicyandiamide is most excellent.

In order to accelerate the curing reaction of the epoxy compound at a temperature of 80° C or higher, conventional curing accelerators for epoxy resins may be added to the photosensitive resin composition of this invention. The use of this accelerator is advantageous in shortening the curing time. Examples of the curing accelerator are amine-boron trifluoride complex, fluoboric acid amine salt, tetraphenylphosphonium tetraphenylborate, 2-ethyl-4-methylimidazole, 2-ethyl-4-methylimidazole-zinc octenate complex and the like. In general, the curing accelerator may be used in an amount of 0 to 5% by weight based on the weight of the epoxy compound.

In addition to the above-mentioned components, the photosensitive resin composition of this invention may contain auxiliary components for various purposes, such as a thermal polymerization inhibitor for storage stability, a linear high molecular weight binder for controlling the resolving power and mechanical strengths, for example, vinyl polymers and cellulose, and a plasticizer, for example, triethylene glycol diacetate and dioctyl phthalate. Furthermore, dyestuffs, pigments and various fillers may be added to the composition. The selection of these auxiliary components may be made in the same consideration as in the production of conventional photosensitive resin compositions.

When the fourth essential component is other than the polycarboxylic acid, a copolymer of acrylic or methacrylic acid with other vinyl compounds may be added as a curing accelerator for the epoxy compound to the photosensitive resin composition, to obtain a very good result.

The photosensitive resin composition of this invention has the same sensitivity as conventional photosensitive resin compositions, is sufficiently stable against heat at a temperature of 80° C or lower, and can be formed into a protective film in a conventional manner. The photosensitive resin composition of this invention is usually dissolved in an organic solvent, such as methyl ethyl ketone, toluene, chloroform or the like so that the concentration may become 3 to 80% by weight, to prepare a sensitive solution, and this solution is then applied to a base plate to be protected in the following general manner (1) or (2) to form a sensitive layer on the plate:

1. The sensitive solution is coated on the base plate and then dried.
2. The sensitive solution is coated on such a film as polyethylene terephthalate film, and then dried. The resulting coated film is adhered to the base plate by use of a hot roll.

The sensitive layer is exposed to active rays corresponding to a desired image pattern through a negative mask to cure the exposed parts of the layer, and then subjected to development with a solvent, such as 1,1,1-trichloroethane or the like to dissolve the unexposed parts of the layer in the solvent. The thus obtained protective film corresponding to the image pattern acts as a corrosion resistant film in conventional etching, plating or the like. The above film can be allowed to have an excellent strength by subjecting it to a heat treatment at a temperature of 80° C to 300° C, usually 100° to 170° C for a period of 15 min to 24 hrs. The thus heat-treated protective film is resistant against aromatic hydrocarbons such as toluene or the like; chlorinated hydrocarbons such as Triclene or the like; and ketones such as methyl ethyl ketone or the like, and also sufficiently resistant to strongly acidic or alkaline solutions. Further, it is excellent in heat resistance and mechanical strengths, and hence, it can be used as a permanent protective film for solder resist or the like.

Since the photosensitive resin composition of this invention has an excellent sensitivity and excellent chemical and mechanical properties, it can be employed as a photosensitive adhesive, a paint, a plastic relief or a material for printing plate.

This invention is further explained in detail by referring to Examples, which are not by way of limitation but by way of illustration. In the Examples, all parts and percentages are by weight unless otherwise specified.

EXAMPLE 1

| | |
|---|---|
| Methyl methacrylate-methacrylic acid copolymer (98/2 weight ratio) | 40 parts |
| Pentaerythritol triacrylate | 30 parts |
| Epoxy resin (ECN-1280) | 25 parts |
| Dicyandiamide | 1.5 parts |
| Benzophenone | 2.7 parts |

| | |
|---|---|
| Michiler's ketone | 0.3 part |
| p-Methoxyphenol | 0.6 part |
| Methyl ethyl ketone | 200 parts |

A photosensitive resin composition of the above prescription was prepared, applied to a copper-clad laminate, and dried at room temperature for 10 min and at 80° C for 10 min to form a sensitive layer having a thickness of 20 $\mu$. The resulting sensitive layer is covered with transparent polyethylene terephthalate film having a thickness of 25 $\mu$, and then exposed to rays through a negative mask from a 3 KW super-high pressure mercury lamp manufactured by Orc Seishakusho at an intensity of 4000 $\mu$W/cm$^2$ for 60 sec., immediately after which the layer was heated at 80° C for 5 min and then cooled. The polyethylene terephthalate film was thereafter peeled off from the layer, and the layer was subjected to spray-development with 1,1,1-trichloroethane for 1 min. The thus developed layer was subjected to heat-treatment at 150° C for 2 hrs. to obtain a protective film in the precision form of image corresponding to the negative mask. This protective film did not change at all even when dipped for 10 hrs in each of methyl ethyl ketone, acetone, chloroform, Triclene, methanol, isopropanol, 50% aqueous sulfuric acid solution, toluene, benzene and xylene, and no cracking or whitening of the protective film was found even after the film was further dipped in an aqueous sodium hydroxide solution of a pH of 12 at 70° C for 100 hrs, and no separation of the film from the copper foil was seen. After the above tests on solvent resistance and chemical resistance, the film was dipped in a solder bath at a temperature of 260°–270° C for 2 min to find no change in the film. From these results, it was seen that the protective film obtained in this Example could sufficiently be used as a resist for etching, plating or strongly alkaline non-electrolytic chemical plating and as a solder resist.

EXAMPLE 2

| | |
|---|---|
| Methyl methacrylate-$\beta$-hydroxyethyl methacrylate copolymer (95/5 weight ratio) | 45 parts |
| Trimethylolpropane triacrylate | 10 parts |
| t-Butylanthraquinone | 4 parts |
| p-Methoxyphenol | 0.6 part |
| A-BPE 4 (a trade name of Shin Nakamura Kagaku Kabushiki Kaisha) | 30 parts |
| Epoxy resin (Epikote 828) | 15 parts |
| Epoxy resin (Epikote 1001) | 20 parts |
| Boron trifluoride-monoethylamine complex | 1.0 part |
| Phthalocyanine blue | 0.2 part |
| Aerosil No. 380 (a trade name of Nippon Aerosil Kabushiki Kaisha) | 2.5 parts |
| Paraffin (melting point: 60–62° C) 10% styrene solution | 0.2 part |
| Methyl ethyl ketone | 120 parts |
| Dicyandiamide | 1.2 parts |

A photosensitive resin composition of the above prescription was prepared, applied to a copper-clad laminate in the dip-coat method (taking out velocity: 15 cm/min), and dried at room temperature for 1 day. A negative mask was placed on the photosensitive resin composition layer, and the layer was exposed to rays in the same manner as in Example 1 and then developed in the same manner as in Example 1, except that a Triclenemethyl ethyl ketone (60/40) mixture solvent was substituted for the 1,1,1-trichloroethane as the developing solution. The resulting assembly was then heated at 150° C for 3 hrs. The thus obtained protective film was sufficiently corrosion resistant to use as a corrosion resistant film in conventional etching with ferric chloride, and even after the etching, could be used as a permanent protective film.

EXAMPLE 3

| | |
|---|---|
| Diallyl phthalate prepolymer (DAPCN-M, a trade name of Sumitomo Chemical Co., Ltd.) | 20 parts |
| Polyethylene glycol diacrylate (A-9G, a trade name of Shin Nakamura Kagaku Kabushiki Kaisha) | 10 parts |
| Pentaerythritol tetraacrylate | 15 parts |
| Epoxy resin (Epikote 828) | 5 parts |
| Epoxy resin (ECN-1280) | 10 parts |
| Dicyandiamide | 0.8 part |
| 2-Ethylanthraquinone | 3.0 parts |
| 2,2'-Methylenebis-(4,4'-diethyl-6,6'-di-t-butylphenol) | 0.3 part |
| Methyl ethyl ketone | 100 parts |

A photosensitive resin composition of the above prescription was prepared, applied to a polyethylene teraphthalate film having a thickness of 25 $\mu$ and dried to form a sensitive layer having a thickness of 30 $\mu$. The thus obtained sensitive layer was adhered to a cleaned steel plate under heat and pressure by use of a hot roll. Exposure and development were made in the same manner as in Example 1. Finally, the resulting assembly was heated at 170° C for 3 hrs. The resulting protective film had a pencil hardness of 4H, and when dipped in methyl ethyl ketone, toluene, a 10% aqueous sodium hydroxide solution or boiling water for 24 hrs, no change, such as whitening, peeling off or the like, was observed.

EXAMPLE 4

| | |
|---|---|
| Methyl methacrylate-methacrylic acid copolymer (98/2 weight ratio) | 40 parts |
| Pentaerythritol triacrylate | 12 parts |
| Polyethylene glycol dimethacrylate (n = 9) | 18 parts |
| p,p'-Diaminodiphenyl ether | 3.0 parts |
| p-Methoxyphenol | 0.5 part |
| Benzophenone | 2.5 parts |
| Epoxy resin (ECN-1280) | 25 parts |
| Michiler's ketone | 0.5 part |
| Methyl ethyl ketone | 200 parts |

A photosensitive resin composition of the above prescription was prepared, applied to a polyethylene terephthalate film having a thickness of 25 $\mu$, and then dried to form a sensitive layer having a thickness of 50 $\mu$. This sensitive layer was adhered to a copper-clad laminate under heat and pressure by use of a hot roll. The sensitive layer was exposed to rays through a negative mask from a 3 KW super-high pressure mercury lamp 70 cm distant from the layer for 60 sec. Immediately thereafter, the exposed layer was heated at 80° C for 5 min, cooled, and then the polyethylene terephthalate film was peeled off from the sensitive layer. The sensitive layer was subjected to spray-development with 1,1,1-trichloroethane for 1 min, and then subjected to heat treatment at 150° C for 2 hrs to obtain a protective film having the accurate image form corresponding to the negative mask. This protective film had a pencil hardness of 2H and an Erichsen value of 5 mm.

When the protective film was dipped in methyl ethyl ketone, acetone, chloroform, Triclene, methanol, xylene or a 50% aqueous sulfuric acid solution for 10 hrs, no change was observed, and when further dipped in an aqueous sodium hydroxide solution of a pH of 12 at 70° C for 4i hrs, there was neither seen phenomena such as whitening, cracking and the like. Even when the protective film was dipped in a solder bath at 260°–270° C for 30 sec., no change was found. From these results, it can be seen that the protective film obtained in this Example can sufficiently be used as a resist for conventional etching, plating or strongly alkaline non-electrolytic plating and as a solder resist.

EXAMPLE 5

A protective film of the image form was prepared in the same manner as in Example 4, except that p,p'-diaminodiphenylmethane, p,p'-diaminodiphenyl sulfone or p, p'-diaminodiphenyl-dimethylmethane was substituted for the p,p'-diaminodiphenyl ether. In each case protective film had resistance to chemicals, solvents and heat similar to that in Example 4.

EXAMPLE 6

| | |
|---|---|
| Methyl methacrylate-β-hydroxyethyl methacrylate copolymer (95/5 weight ratio) | 45 parts |
| Trimethylolpropane triacrylate | 10 parts |
| t-Butylanthraquinone | 4 parts |
| p-Methoxyphenol | 0.6 part |
| A-BPE-4 (a trade name of Shin Nakamura Kagaku Kabushiki Kaisha for a compound assumed to be an acrylic ester of an alkylene oxide adduct of bisphenol A | 30 parts |
| Epoxy resin (Epikote 828) | 15 parts |
| Epoxy resin (Epikote 1001) | 20 parts |
| Boron trifluoride-monoethylamine complex | 0.3 part |
| p,p'-diaminodiphenyl ether | 2.5 parts |
| Phthalocyanine blue | 0.2 part |
| Aerosil No. 380 | 2.0 parts |
| Paraffin (melting point: 60–62° C) 10 % styrene solution | 0.2 part |
| Methyl ethyl ketone | 120 parts |

A photosensitive resin composition of the above prescription was prepared, applied to a copper-clad laminate by the dip coat method and then dried at room temperature for 1 day. A negative mask was placed on the resulting sensitive layer, and the sensitive layer was subjected to exposure and development in the same manner as in Example 4, except that a Triclene-methyl ethyl ketone (60:40) mixture solvent was substituted for the 1,1,1-trichloroethane. Finally, the sensitive layer was heated at 150° C for 3 hrs. The thus obtained protective film had a pencil hardness of 3H and was excellent in resistance to solvents, chemicals and heat similarly to that obtained in Example 4. It was further found that the protective film obtained in this Example can sufficiently be used as a resist for etching with ferric chloride in a conventional manner and even after the etching can be sufficiently used as a permanent protective film.

EXAMPLE 7

| | |
|---|---|
| Methyl methacrylate-methacrylic acid copolymer (95/5 weight ratio) | 50 parts |
| Pentaerythritol triacrylate | 30 parts |
| Benzophenone | 2.7 parts |
| Michiler's ketone | 0.3 part |
| p-Methoxyphenol | 0.6 part |
| Araldite ECN-1280 | 10 parts |
| Victoria pure blue 130 | 0.18 part |
| Tetraphenylphosphonium tetraphenylborate | 0.2 part |
| Methyl ethyl ketone | 100 parts |

A photosensitive resin composition of the above prescription was prepared, applied to a copperclad laminate and dried at room temperature for 10 min and then at 80° C for 10 min to obtain a sensitive layer having a thickness of 20 μ. The resulting sensitive layer was covered with a transparent polyethylene terephthalate film having a thickness of 25 μ and then exposed to rays under the same conditions as in Example 1, and immediately thereafter, heated at 80° C for 15 min, after which the sensitive layer was cooled. The polyethylene terephthalate film was removed from the sensitive layer, and the latter was subjected to spray-development with 1,1,1-trichloroethane for 1 min, and then, heated at 160° C for 1 hr. The thus obtained protective film had a resolving power of 12.5 lines/mm, and even when the film was dipped in methyl ethyl ketone, chloroform or the like for 10 hrs, no change was seen. Even when the film was further dipped in a solder bath at 260°–270° C for 2 min, no change was seen. Moreover, when the film was dipped in an alkaline aqueous solution of a pH of 12 at 70° C for 100 hrs, neither peeling nor degradation of the protective film were seen.

EXAMPLE 8

| | |
|---|---|
| Methyl methacrylate-methacrylic acid copolymer (95/5 weight ratio) | 50 parts |
| Trimethylolpropane triacrylate | 30 parts |
| Benzophenone | 2.5 parts |
| Michiler's ketone | 0.5 part |
| p-Methoxyphenol | 0.6 part |
| Hexahydrophthalic anhydride | 7 parts |
| Araldite ECN-1280 | 15 parts |
| 2-Ethyl-4-methylimidazole-zinc octenate complex | 0.2 part |
| Methyl ethyl ketone | 100 parts |

A photosensitive resin composition of the above prescription was prepared, applied to a polyethylene terephthalate film having a thickness of 35 μ, and then dried to obtain a sensitive layer having a thickness of 35 μ. This sensitive layer was adhered to a copper-clad laminate under heat and pressure by use of a hot roll. The resulting assembly was exposed to rays for 60 sec. in the same manner as in Example 7, heated at 80° C for 5 min, subjected to development in the same manner as in Example 7, and finally heated at 130° C for 2 hrs. The resulting protective film was found to be able to be used as a corrosion resistant film in etching with conventional ferric chloride and also used to premanently protect the covered portion even after the etching without peeling.

EXAMPLE 9

| | |
|---|---|
| Methyl methacrylate-glycidyl methacrylate copolymer (95/5 weight ratio) | 50 parts |
| Pentaerythritol triacrylate | 25 parts |
| 2-Ethylanthraquinone | 4.0 parts |
| Epoxy resin curing agent HN-2200 (a trade name of Hitachi Chemical for a composition containing mainly 3-methyltetrahydrophthalic | |

-continued

| | |
|---|---|
| anhydride) | 10 parts |
| Epoxy resin (Epikote 828) | 10 parts |
| p-Methoxyphenol | 0.8 part |
| Phthalocyanine green | 0.2 part |
| Methyl ethyl ketone | 100 parts |

A photosensitive resin composition of the above prescription was prepared, and a protective film having an image form was obtained on a copper-clad laminate using the photosensitive resin composition in the same manner as in Example 8. This protective film had a pencil hardness of 4H, and when the film was dipped in methyl ethyl kitone, toluene, a 10% aqueous sodium hydroxide solution or boiling water for 24 hrs, no change was observed.

As is clear from the above Examples, the photosensitive resin composition of this invention is excellent in resistance to solvents, chemicals and heat and also in mechanical strengths, and can be used as a solder resist or a resist for non-electrolytic copper plating, as which the conventional photosensitive resin compositions have not been able to be employed, and also can be used as a permanent protective film. Since the photosensitive resin composition of this invention has the above-mentioned excellent properties, it can be used in a broad field, such as in the production of conventional printed circuit boards, in precision-processing of metals, in paints, sensitive adhesives, plastic relief materials and as materials for printing plates.

What is claimed is:

1. A photosensitive resin composition which consists essentially of (A) 10 to 90% by weight of a photopolymerizable unsaturated compound containing at least two terminal ethylene groups, (B) 0.1 to 15% by weight of a sensitizer capable of initiating polymerization of the above unsaturated compound upon irradiation with active rays, (C) 5 to 80% by weight of a compound having at least two epoxy groups and (D) a compound selected from the group consisting of 0.1 to 20% by weight dicyandiamide, 1 to 30% by weight p,p'-diaminodiphenyl compounds, and 0.3 to 1.5 moles per mole of epoxy group of a polycarboxylic acid having at least two carboxyl groups, a polycarboxylic anhydride or mixtures thereof.

2. A photosensitive resin composition according to claim 1, wherein the photo-polymerizable unsaturated compound is an acrylic or methacrylic ester of a polyhydric alcohol.

3. A photosensitive resin composition according to claim 2, wherein the polyhydric alcohol is triethylene glycol, tetraethylene glycol, ethylene glycol, propylene glycol, trimethylolpropane, pentaerythritol or neopentyl glycol.

4. A photosensitive resin composition according to claim 1, wherein the photo-polymerizable unsaturated compound is an acrylate or methacrylate of alkylene oxide adduct of bisphenol A.

5. A photosensitive resin composition according to claim 1, wherein the proportion of the (A) component is 10 to 90% by weight based on the weight of the composition.

6. A photosensitive resin composition according to claim 1, wherein the sensitizer is benzophenone, Michiler's ketone, benzoin, benzoin alkyl ether, 2-ethylanthraquinone, 3-t-butylanthraquinone or benzil.

7. A photosensitive resin composition according to claim 1, wherein the proportion of the (B) component is 0.1 to 15% by weight based on the weight of the composition.

8. A photosensitive resin composition according to claim 1, wherein the (C) component is a novolac type epoxy resin prepolymer.

9. A photosensitive resin composition according to claim 1, wherein the (D) component is dicyandiamide, and the proportion thereof is 0.1 to 20% by weight based on the weight of the composition.

10. A photosensitive resin composition according to claim 1, wherein the (D) component is a p,p'-diaminodiphenyl compound, and the proportion thereof is 1 to 30% by weight based on the weight of the composition.

11. A photosensitive resin composition according to claim 10, wherein the p,p'-diaminodiphenyl compound is p,p'-diaminodiphenylmethane, p,p'-diaminodiphenyl ether, p,p'-diaminodiphenyl sulfone, or p,p'-diaminodiphenyl-dimethylmethane.

12. A photosensitive resin composition according to claim 1 wherein the (D) component is a polycarboxylic acid haing at least two carboxyl groups, a polycarboxylic anhydric or a mixture thereof.

13. A photosensitive resin composition according to claim 12, wherein the proportion of the (D) component is 0.3 to 1.5 moles per mole of the (C) component.

14. A photosensitive resin composition according to claim 1, which further contains up to 5% by weight, based on the weight of the composition, of a curing accelerator for epoxy resin selected from the group consisting of amine-boron trifluoride complex, fluoboric acid amine salt, tetraphenylphosphonium tetraphenylborate, 2-ethyl-4-methylimidazole and 2-ethyl-4-methylimidazole-zinc octenate complex.

15. A photosensitive resin composition according to claim 14, which further contains a heat-polymerization inhibitor, a linear high molecular weight binder or a plasticizer.

16. A photosensitive resin composition according to claim 14, which further contains a copolymer of acrylic or methacrylic acid with other vinyl compounds.

17. A photosensitive resin composition according to claim 16, wherein the (C) component is novolac type epoxy resin prepolymer and the (D) component is dicyandiamide.

18. A photosensitive resin composition according to claim 2, wherein said photo-polymerizable unsaturated compound is pentaerythritol triacrylate.

19. A photosensitive resin composition according to claim 18, wherein the (D) component is dicyandiamide.

20. A photosensitive resin composition according to claim 2, wherein the (D) component is dicyandiamide.

21. A photosensitive resin composition according to claim 2, wherein the polyhydric alcohol is tetraethylene glycol.

22. A photosensitive resin composition according to claim 2, wherein the polyhydric alcohol is trimethylolpropane.

23. A photosensitive resin composition according to claim 2, wherein the polyhydric alcohol is pentaerythritol.

24. A photosensitive resin composition according to claim 2, wherein said photo-polymerizable unsaturated compound is selected from the group consisting of pentaerythritol triacrylate, trimethylolpropane triacrylate, and pentaerythritol tetraacrylate.

25. A photosensitive resin composition consisting essentially of (A) 10 to 90% by weight of a photo-polymerizable unsaturated compound containing at least two terminal ethylene groups, (B) 0.1 to 15% by weight of a sensitizer capable of initiating said photo-polymerizable unsaturated compound upon irradiation with active rays, (C) 5 to 80% by weight of a compound having at least two epoxy groups and (D) 0.1 to 20% by weight dicyandiamide.

26. A photosensitive resin composition according to claim 25, wherein the photo-polymerizable unsaturated compound is an acrylic or methacrylic ester of a polyhydric alcohol.

* * * * *